(12) United States Patent
Morikazu et al.

(10) Patent No.: US 10,610,974 B2
(45) Date of Patent: Apr. 7, 2020

(54) LASER PROCESSING APPARATUS AND LASER PROCESSING METHOD

(71) Applicant: DISCO CORPORATION, Tokyo (JP)

(72) Inventors: Hiroshi Morikazu, Tokyo (JP); Tomoki Yoshino, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/025,037

(22) Filed: Jul. 2, 2018

(65) Prior Publication Data

US 2019/0009373 A1   Jan. 10, 2019

(30) Foreign Application Priority Data

Jul. 6, 2017   (JP) .................................. 2017-132458

(51) Int. Cl.
| | | |
|---|---|---|
| *B23K 26/53* | (2014.01) | |
| *H01L 21/78* | (2006.01) | |
| *H01L 21/67* | (2006.01) | |
| *H01L 21/268* | (2006.01) | |
| *B23K 26/03* | (2006.01) | |
| *B23K 26/08* | (2014.01) | |
| *B23K 26/382* | (2014.01) | |
| *B23K 26/0622* | (2014.01) | |
| *B23K 26/402* | (2014.01) | |
| *B23K 103/00* | (2006.01) | |
| *B23K 101/40* | (2006.01) | |

(52) U.S. Cl.
CPC ............ *B23K 26/53* (2015.10); *B23K 26/032* (2013.01); *B23K 26/0622* (2015.10); *B23K 26/0853* (2013.01); *B23K 26/382* (2015.10); *B23K 26/402* (2013.01); *H01L 21/268* (2013.01); *H01L 21/67092* (2013.01); *H01L 21/78* (2013.01); *B23K 2101/40* (2018.08); *B23K 2103/56* (2018.08)

(58) Field of Classification Search
None
See application file for complete search history.

(56) References Cited

U.S. PATENT DOCUMENTS 9,209,591 B2 * 12/2015 Takeda ....................... H01S 3/10
2013/0059428 A1    3/2013 Arai
(Continued)

FOREIGN PATENT DOCUMENTS

| JP | 10-305420 | 11/1998 |
|---|---|---|
| JP | 10305420 A | 11/1998 |

(Continued)

*Primary Examiner* — Robert K Carpenter
(74) *Attorney, Agent, or Firm* — Greer Burns & Crain Ltd.

(57) ABSTRACT

A laser processing method includes holding a single crystal silicon wafer as a workpiece, selecting a laser beam having a wavelength of 1950 nm or more in a transmission wavelength region to the single crystal silicon wafer, and applying the laser beam to the single crystal silicon wafer along a predetermined area with the focal point of the laser beam set inside the wafer, thereby forming a plurality of shield tunnels arranged along the predetermined area. Each shield tunnel is composed of a fine hole and an amorphous region formed around the fine hole for shielding the fine hole. The fine hole extends from a beam applied surface of the wafer where the laser beam is applied to the other surface opposite to the beam applied surface.

7 Claims, 4 Drawing Sheets

(56) References Cited

U.S. PATENT DOCUMENTS

2013/0134142 A1* 5/2013 Morikazu .............. B23K 26/00
                                                                 219/121.75
2014/0334511 A1   11/2014 Takeda
2017/0372966 A1* 12/2017 Ravi .................... C30B 25/186
2019/0057892 A1   2/2019 Morikazu

FOREIGN PATENT DOCUMENTS

| JP | 2002-192370  | 7/2002  |
|----|--------------|---------|
| JP | 2002192370 A | 7/2002  |
| JP | 2014-221483  | 11/2014 |
| JP | 2014221483 A | 11/2014 |

* cited by examiner

LASER PROCESSING APPARATUS AND LASER PROCESSING METHOD

BACKGROUND OF THE INVENTION

Field of the Invention

The present invention relates to a laser processing apparatus for forming shield tunnels in a single crystal silicon wafer, and also relates to a laser processing method for forming shield tunnels in a single crystal silicon wafer.

Description of the Related Art

A plurality of devices such as integrated circuits (ICs) and large scale integrated circuits (LSIs) are formed on the front side of a wafer so as to be separated by a plurality of crossing division lines formed on the front side of the wafer. The wafer thus having the plural devices on the front side is divided along the division lines into individual device chips by using a laser processing apparatus. The device chips thus obtained are used in various electric equipment such as mobile phones and personal computers.

There are various types of laser processing methods using a laser processing apparatus. For example, the following types (1), (2), and (3) are known in the art.

(1) A laser beam having an absorption wavelength to a workpiece is applied to the workpiece in the condition where the focal point of the laser beam is set on the upper surface of the workpiece, thereby performing ablation to form a groove as a division start point on the upper surface of the workpiece (see Japanese Patent Laid-Open No. 1998-305420, for example).

(2) A laser beam having a transmission wavelength to a workpiece is applied to the workpiece in the condition where the focal point of the laser beam is set inside the workpiece, thereby forming a modified layer as a division start point inside the workpiece (see Japanese Patent No. 3408805, for example).

(3) A laser beam having a transmission wavelength to a workpiece is applied to the workpiece in the condition where the focal point of the laser beam is set at a predetermined position inside the workpiece, thereby forming a plurality of shield tunnels as a division start point in the workpiece, in which each shield tunnel is composed of a fine hole and an amorphous region formed around the fine hole for shielding the fine hole, and the fine hole extends from the front side of the workpiece to the back side thereof (see Japanese Patent Laid-Open No. 2014-221483, for example).

Japanese Patent Laid-Open No. 2014-221483 mentioned above states that sapphire ($Al_2O_3$), silicon carbide (SiC), and gallium nitride (GaN) were extracted as the material of a wafer to repeatedly conduct a test for determining the conditions that the shield tunnels can be properly formed. According to the result of this test, the wavelength of the laser beam to be applied to the wafer is set to 1030 nm and the numerical aperture of a focusing lens for focusing and applying the laser beam to the wafer is decided so that the value obtained by dividing the numerical aperture of the focusing lens by the refractive index of the material of the wafer falls within the range of 0.05 to 0.2.

SUMMARY OF THE INVENTION

The present inventors conducted a test using single crystal silicon as the material of the wafer and applying the conditions disclosed in Japanese Patent Laid-Open No. 2014-221483 to the single crystal silicon wafer. However, it was found that proper shield tunnels cannot be formed in this case.

It is therefore an object of the present invention to provide a laser processing apparatus which can form proper shield tunnels in a single crystal silicon wafer.

It is another object of the present invention to provide a laser processing method which can form proper shield tunnels in a single crystal silicon wafer.

In accordance with an aspect of the present invention, there is provided a laser processing apparatus including a chuck table for holding a workpiece; the workpiece including a single crystal silicon wafer; and a laser beam applying unit including focusing means having a focusing lens for applying a laser beam to the workpiece held on the chuck table to thereby process the workpiece; the laser beam applying unit further including a laser oscillator for oscillating a pulsed laser beam having a wavelength of 1950 nm or more in a transmission wavelength region to the single crystal silicon wafer as the laser beam.

Preferably, the numerical aperture of the focusing lens is set so that the value obtained by dividing the numerical aperture of the focusing lens by the refractive index of single crystal silicon falls within the range of 0.05 to 0.2.

In accordance with another aspect of the present invention, there is provided a laser processing method using a laser processing apparatus including a chuck table for holding a workpiece and a laser beam applying unit including focusing means having a focusing lens for applying a laser beam to the workpiece held on the chuck table to thereby process the workpiece, the laser processing method including a single crystal silicon wafer selecting step of selecting a single crystal silicon wafer as the workpiece; a laser beam selecting step of selecting a pulsed laser beam having a wavelength of 1950 nm or more in a transmission wavelength region to the single crystal silicon wafer as the laser beam; and a shield tunnel forming step of applying the pulsed laser beam to the single crystal silicon wafer along a predetermined area in the condition where the focal point of the pulsed laser beam is set inside the single crystal silicon wafer, thereby forming a plurality of shield tunnels arranged along the predetermined area, each shield tunnel being composed of a fine hole and an amorphous region formed around the fine hole for shielding the fine hole, the fine hole extending from a beam applied surface of the single crystal silicon wafer where the pulsed laser beam is applied to the other surface opposite to the beam applied surface.

Preferably, the laser processing method further includes a numerical aperture deciding step of deciding the numerical aperture of the focusing lens so that the value obtained by dividing the numerical aperture of the focusing lens by the refractive index of single crystal silicon falls within the range of 0.05 to 0.2.

According to the laser processing method of the present invention, proper shield tunnels can be formed in a single crystal silicon wafer.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

There will now be described a preferred embodiment of the laser processing apparatus according to the present invention, with reference to the drawings.

Figure 1:
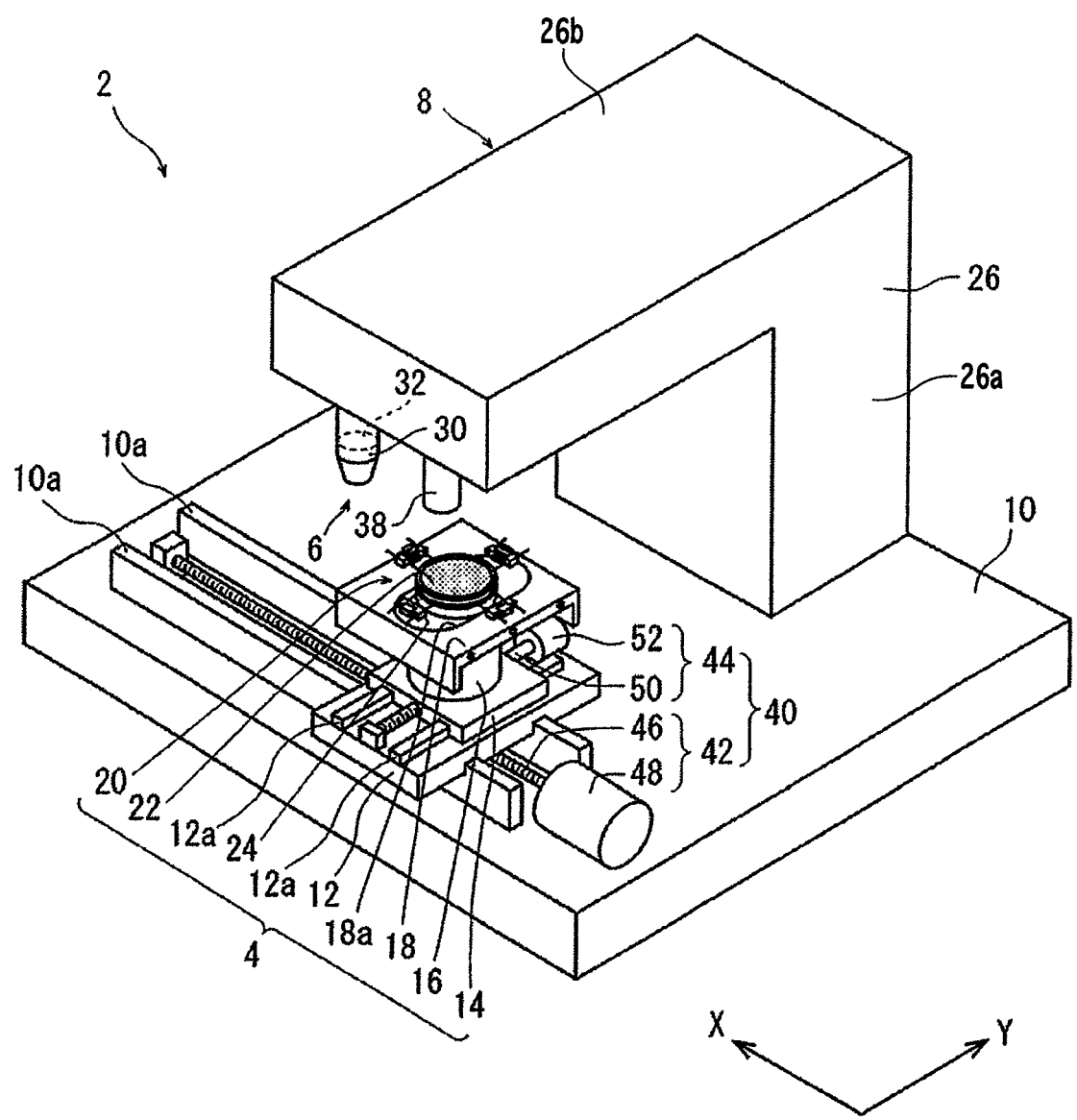
FIG. 1 is a perspective view of a laser processing apparatus according to a preferred embodiment of the present invention.

Referring to FIG. 1, there is shown a laser processing apparatus 2 according to this preferred embodiment. The laser processing apparatus 2 includes a holding unit 4 for holding a workpiece such as a wafer and a laser beam applying unit 8 having focusing means 6 for applying a laser beam to the workpiece held by the holding unit 4, thereby processing the workpiece.

As shown in FIG. 1, the holding unit 4 and the laser beam applying unit 8 are provided on a base 10. The holding unit 4 includes a rectangular X movable plate 12 mounted on the base 10 so as to be movable in an X direction, a rectangular Y movable plate 14 mounted on the X movable plate 12 so as to be movable in a Y direction, a cylindrical support 16 fixed to the upper surface of the Y movable plate 14, and a rectangular cover plate 18 fixed to the upper end of the support 16. The cover plate 18 is formed with an elongated hole 18a extending in the Y direction. A circular chuck table 20 is rotatably mounted on the upper end of the support 16 so as to extend through the elongated hole 18a of the cover plate 18. A circular vacuum chuck 22 is provided on the upper surface of the chuck table 20. The vacuum chuck 22 has a substantially horizontal upper surface as a holding surface. The vacuum chuck 22 is formed of a porous material. The vacuum chuck 22 is connected through a suction passage (not shown) to a suction unit (not shown) for generating a vacuum. Accordingly, when the suction unit is operated, a suction force is produced on the upper surface of the vacuum chuck 22 of the chuck table 20, so that the workpiece such as a wafer placed on the upper surface of the vacuum chuck 22 can be held under suction. Further, a plurality of clamps 24 are provided on the outer circumference of the chuck table 20 so as to be arranged at given intervals in the circumferential direction thereof. The X direction is defined as the direction shown by an arrow X in FIG. 1, and the Y direction is defined as the direction shown by an arrow Y in FIG. 1 and perpendicular to the X direction. The plane defined by the X direction and the Y direction is a substantially horizontal plane.

Figure 2:
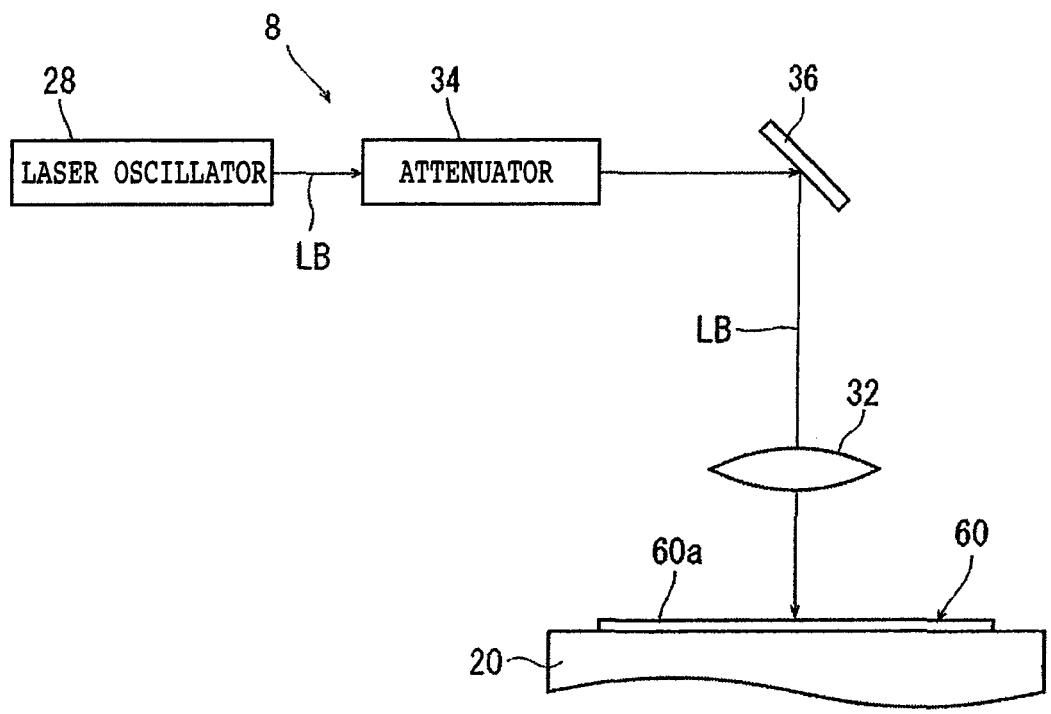
FIG. 2 is a block diagram of a laser beam applying unit shown in FIG. 1.
Figure 3:
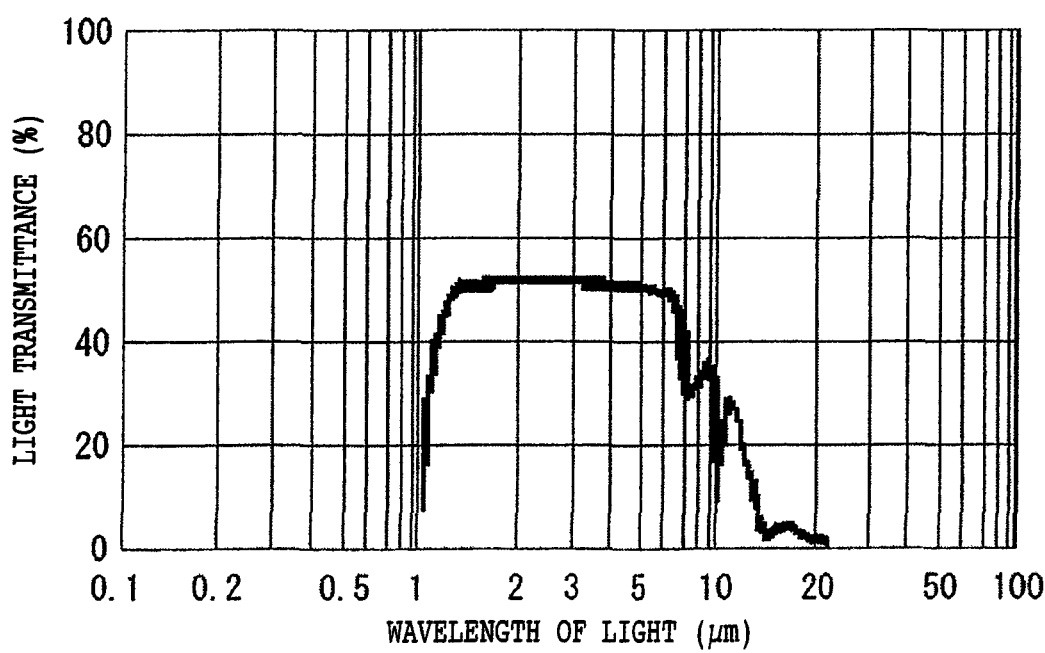
FIG. 3 is a graph showing the general relation between the light transmission of single crystal silicon and the wavelength of light.

The laser beam applying unit 8 will now be described with reference to FIGS. 1 and 2. The laser beam applying unit 8 includes an inverted L-shaped housing 26 (see FIG. 1) and a laser oscillator 28 (see FIG. 2) incorporated in the housing 26. The housing 26 is composed of a vertical portion 26a extending upward from the upper surface of the base 10 at a rear end portion thereof and a horizontal portion 26b extending from the upper end of the vertical portion 26a in a substantially horizontal direction (in the Y direction) toward the position above the holding unit 4. The laser oscillator 28 is configured so as to oscillate a pulsed laser beam LB having a wavelength of 1950 nm or more in a transmission wavelength region to a single crystal silicon wafer. In general, as shown in FIG. 3, the light transmittance of single crystal silicon tends to change with a change in wavelength of light in such a manner that the light transmittance increases with an increase in wavelength of light from near 1050 nm which is an absorption edge of single crystal silicon, that the light transmittance is almost constant at approximately 55% in the wavelength region of approximately 1200 to 6000 nm, and that the light transmittance decreases with an increase in wavelength of light in the wavelength region exceeding approximately 6000 nm.

The laser beam applying unit 8 will further be described with reference to FIGS. 1 and 2. As shown in FIG. 1, the focusing means 6 of the laser beam applying unit 8 is provided on the lower surface of the horizontal portion 26b of the housing 26 at the front end portion. The focusing means 6 includes a cylindrical casing 30 vertically movably mounted on the lower surface of the horizontal portion 26b of the housing 26 at the front end portion, a focusing lens 32 incorporated in the casing 30 for focusing the pulsed laser beam LB oscillated by the laser oscillator 28, and a focal position adjusting unit (not shown) for vertically moving the focal point of the pulsed laser beam LB to be focused by the focusing lens 32. The focal position adjusting unit may be configured so as to include a ball screw (not shown) having a screw shaft and a nut portion engaged with the screw shaft and a motor (not shown) connected to one end of the screw shaft, in which the nut portion is fixed to the casing 30 of the focusing means 6, and the screw shaft extends in a vertical direction. With this configuration, a rotary motion by the motor is converted into a linear motion by the ball screw, and this linear motion is transmitted to the casing 30, so that the casing 30 can be vertically moved along a guide rail (not shown) extending in a vertical direction and the focal point of the pulsed laser beam LB to be focused by the focusing lens 32 can therefore be vertically moved. Further, as shown in FIG. 2, the laser beam applying unit 8 further includes an attenuator 34 for adjusting the power of the pulsed laser beam LB oscillated by the laser oscillator 28 and a mirror 36 for reflecting the pulsed laser beam LB adjusted in power by the attenuator 34 and next guiding the pulsed laser beam LB to the focusing lens 32 of the focusing means 6. The power of the pulsed laser beam LB oscillated by the laser oscillator 28 is adjusted to a suitable power by the attenuator 34. Thereafter, the pulsed laser beam LB is reflected by the mirror 36, so that the optical path of the pulsed laser beam LB is changed from a horizontal direction to a vertical direction. The pulsed laser beam LB reflected by the mirror 36 is guided to the focusing lens 32 of the focusing means 6 and then focused by the focusing lens 32. The focused pulsed laser beam LB is applied to the workpiece held on the chuck table 20 of the holding unit 4. Accordingly, the workpiece held on the chuck table 20 is processed by the pulsed laser beam LB applied.

Figure 4:
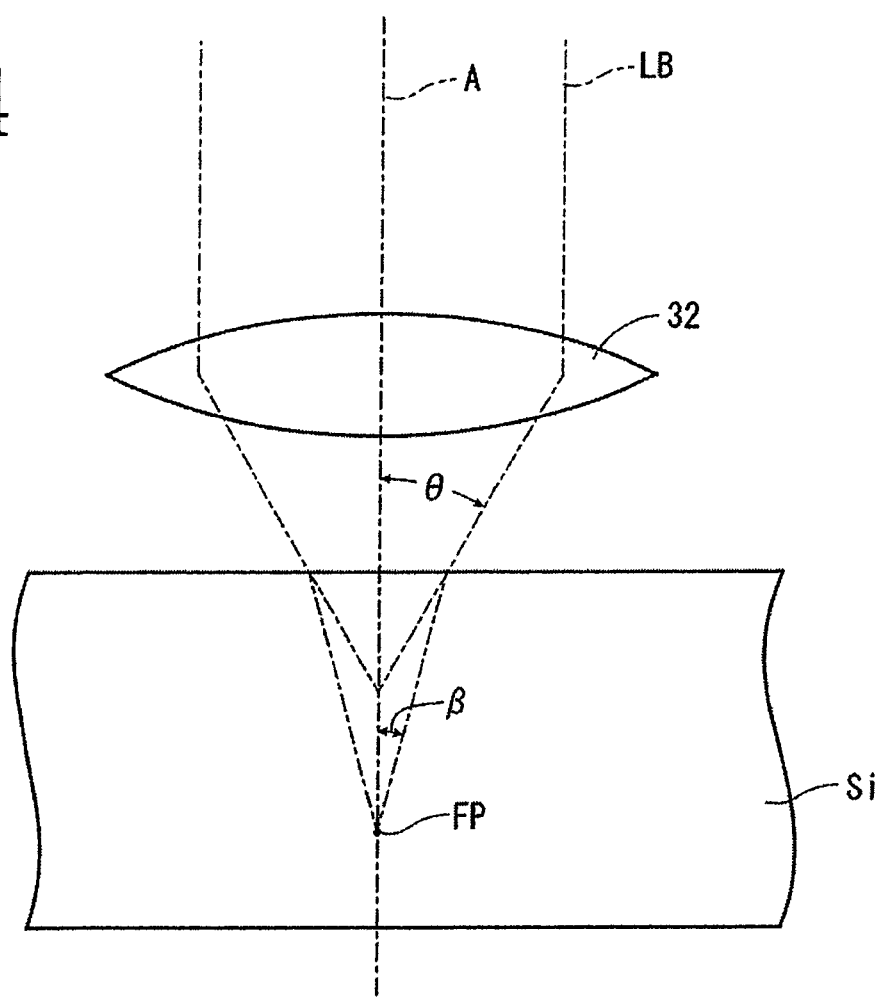
FIG. 4 is a schematic view showing the relation among the numerical aperture of a focusing lens, the refractive index of single crystal silicon, and the value obtained by dividing the numerical aperture of the focusing lens by the refractive index of single crystal silicon.

The numerical aperture NA of the focusing lens 32 in the focusing means 6 is set so that the value S ($S=NA/n$) obtained by dividing the numerical aperture NA of the focusing lens 32 by the refractive index n of single crystal silicon falls within the range of 0.05 to 0.2 (0.05≤S≤0.2). The refractive index n of single crystal silicon is usually approximately 3.7. Accordingly, in the case that the refractive index n of single crystal silicon is 3.7, the numerical aperture NA of the focusing lens 32 is set in the range of 0.185 to 0.74 (0.185≤NA≤0.74). There will now be described the relation among the numerical aperture NA of the focusing lens 32, the refractive index n of single crystal silicon, and the value S (S=NA/n) obtained by dividing the numerical aperture NA of the focusing lens 32 by the refractive index n of single crystal silicon, with reference to FIG. 4. The pulsed laser beam LB that has entered the focusing lens 32 is focused by the focusing lens 32 at an angle θ with respect to the optical axis A of the focusing lens 32. In this case, sin θ is equal to the numerical aperture NA of the focusing lens 32 (NA=sin θ). When the pulsed laser beam LB focused by the focusing lens 32 is applied to single crystal silicon, the pulsed laser beam LB is refracted at an angle β from the angle θ and then focused at a focal point FP inside the single crystal silicon, because the density of single crystal silicon is larger than the density of air. Since the refractive index n is expressed as n=sin θ/sin β, the value S (S=NA/n) obtained by dividing the numerical aperture NA of the focusing lens 32 by the refractive index n of single crystal silicon is equal to sin β. In other words, the condition that the value S (S=NA/n) obtained by dividing the numerical aperture NA of the focusing lens 32 by the refractive index n of single crystal silicon is in the range of 0.05 to 0.2 (0.05≤S≤0.2) is the same meaning as the condition that sin β is in the range of 0.05 to 0.2 (0.05≤sin β≤0.2).

As shown in FIG. 1, the laser processing apparatus 2 further includes an imaging unit 38 mounted on the lower surface of the horizontal portion 26b of the housing 26 of the laser beam applying unit 8 at the front end portion. The imaging unit 38 functions to image the workpiece held by the holding unit 4 and detect an area to be laser-processed. The imaging unit 38 is spaced from the focusing means 6 in the X direction. Although not shown, the imaging unit 38 includes a usual imaging device (charge coupled device (CCD)) for imaging the workpiece by using visible light, an infrared light applying unit for applying infrared light to the workpiece, an optical system for capturing the infrared light applied by the infrared light applying unit, and an imaging device (infrared CCD) for outputting an electrical signal corresponding to the infrared light captured by the optical system.

Referring again to FIG. 1, the laser processing apparatus 2 further includes a moving unit 40 for relatively moving the holding unit 4 and the laser beam applying unit 8. The moving unit 40 includes an X moving unit 42 for moving the chuck table 20 of the holding unit 4 relative to the laser beam applying unit 8 in the X direction, a Y moving unit 44 for moving the chuck table 20 of the holding unit 4 relative to the laser beam applying unit 8 in the Y direction, and a rotating unit (not shown) for rotating the chuck table 20 relative to the support 16 of the holding unit 4. The X moving unit 42 includes a ball screw 46 having a screw shaft and a nut portion engaged with the screw shaft and a motor 48 connected to one end of the screw shaft of the ball screw 46. The screw shaft of the ball screw 46 extends in the X direction on the base 10. The nut portion of the ball screw 46 is fixed to the lower surface of the X movable plate 12. Accordingly, a rotary motion by the motor 48 is converted into a linear motion by the ball screw 46, and this linear motion is transmitted to the X movable plate 12, so that the X movable plate 12 can be moved in the X direction along a pair of guide rails 10a provided on the base 10. In this manner, the chuck table 20 can be moved in the X direction relative to the laser beam applying unit 8 by operating the X moving unit 42. Similarly, the Y moving unit 44 includes a ball screw 50 having a screw shaft and a nut portion engaged with the screw shaft and a motor 52 connected to one end of the screw shaft of the ball screw 50. The screw shaft of the ball screw 50 extends in the Y direction on the X movable plate 12. The nut portion of the ball screw 50 is fixed to the lower surface of the Y movable plate 14. Accordingly, a rotary motion by the motor 52 is converted into a linear motion by the ball screw 50, and this linear motion is transmitted to the Y movable plate 14, so that the Y movable plate 14 can be moved in the Y direction along a pair of guide rails 12a provided on the X movable plate 12. In this manner, the chuck table 20 can be moved in the Y direction relative to the laser beam applying unit 8 by operating the Y moving unit 44. The rotating unit includes a motor (not shown) incorporated in the support 16. Accordingly, the chuck table 20 can be rotated about its axis extending in a vertical direction relative to the support 16 by operating the motor of the rotating unit.

Figure 5:
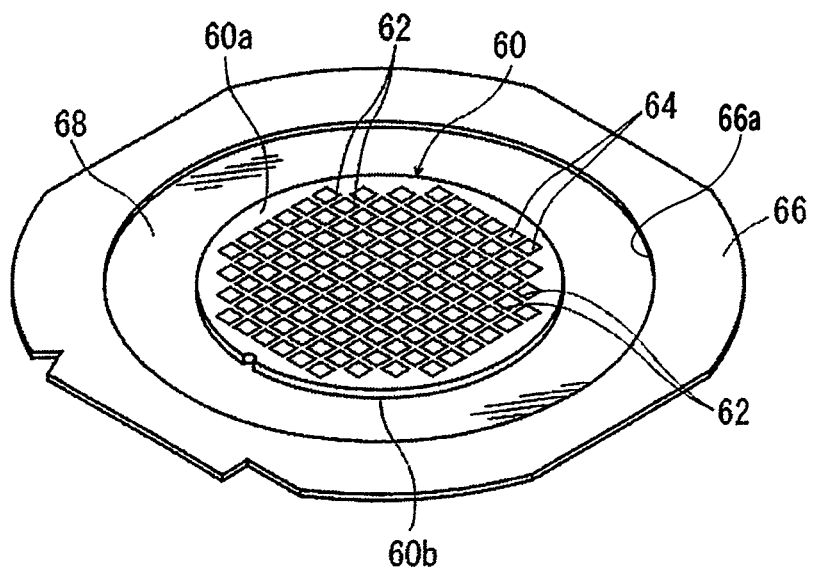
FIG. 5 is a perspective view of a single crystal silicon wafer in the condition where the back side of the wafer is attached to an adhesive tape supported at its peripheral portion to a ring frame.

The laser processing method according to this preferred embodiment will now be described. In this preferred embodiment, a single crystal silicon wafer selecting step is first performed to select a single crystal silicon wafer as the workpiece. FIG. 5 shows a disk-shaped single crystal silicon wafer 60 adapted to be selected in the single crystal silicon wafer selecting step. The single crystal silicon wafer 60 has a front side 60a and a back side 60b opposite to the front side 60a. A plurality of crossing division lines 62 are formed on the front side 60a of the wafer 60 to thereby define a plurality of rectangular separate regions where a plurality of devices 64 such as ICs and LSIs are formed. In this preferred embodiment, the back side 60b of the wafer 60 is attached to a circular adhesive tape 68 previously fixed at its peripheral portion to a ring frame 66 having a central opening 66a. That is, the back side 60b of the wafer 60 is attached to the adhesive tape 68 at its central portion exposed to the central opening 66a of the ring frame 66. As a modification, the front side 60a of the wafer 60 may be attached to the adhesive tape 68.

Further, a laser beam selecting step is performed to select a laser beam having a wavelength of 1950 nm or more in a transmission wavelength region to a single crystal silicon wafer. As described above, the laser oscillator 28 of the laser processing apparatus 2 is so configured as to oscillate a pulsed laser beam LB having a wavelength of 1950 nm or more in a transmission wavelength region to a single crystal silicon wafer. Accordingly, in the laser processing method using the laser processing apparatus 2, the laser beam selecting step is necessarily performed.

Preferably, a numerical aperture deciding step is further performed to decide the numerical aperture of a focusing lens so that the value obtained by dividing the numerical aperture of the focusing lens by the refractive index of single crystal silicon falls within the range of 0.05 to 0.2. As described above, the numerical aperture NA of the focusing lens 32 in the focusing means 6 in the laser processing apparatus 2 is set so that the value S (S=NA/n) obtained by dividing the numerical aperture NA of the focusing lens 32 by the refractive index n of single crystal silicon falls within the range of 0.05 to 0.2 (0.05≤S≤0.2). Accordingly, in the laser processing method using the laser processing apparatus 2, the numerical aperture deciding step is necessarily performed.

After performing the single crystal silicon wafer selecting step, the laser beam selecting step, and the numerical aperture deciding step, a shield tunnel forming step is performed to apply the pulsed laser beam LB to the single crystal silicon wafer 60 along each division line 62 in the condition where the focal point FP of the pulsed laser beam LB is set inside the wafer 60, thereby forming a plurality of shield tunnels arranged along each division line 62, each shield tunnel being composed of a fine hole and an amorphous region formed around the fine hole for shielding the fine hole, the fine hole extending from the front side 60a of the wafer 60 to the back side 60b thereof, that is, extending from the beam applied surface where the pulsed laser beam LB is applied to the other surface opposite to the beam applied surface. In the shield tunnel forming step, the single crystal silicon wafer 60 supported through the adhesive tape 68 to the ring frame 66 is held on the upper surface of the chuck table 20 of the holding unit 4 under suction in the condition where the front side 60a of the wafer 60 is oriented upward. In this condition, the ring frame 66 is fixed at its peripheral portion by the plural clamps 24. Thereafter, the wafer 60 is imaged by the imaging unit 38 set directly above the chuck table 20. Thereafter, the X moving unit 42, the Y moving unit 44, and the rotating unit of the moving unit 40 are operated according to the image of the wafer 60 obtained by the imaging unit 38, thereby moving and rotating the chuck table 20 so that the crossing division lines 62 extending in a first direction and a second direction perpendicular to the first direction are aligned with the X direction and the Y direction, that is, the division lines 62 extending in the first direction are aligned with the X direction and the other division lines 62 extending in the second direction are aligned with the Y direction. Further, the focusing means 6 is positioned directly above one end of a predetermined one of the division lines 62 aligned with the X direction. Thereafter, the focal position adjusting unit is operated to vertically move the focal point FP of the pulsed laser beam LB, thereby setting the focal point FP of the pulsed laser beam LB inside the wafer 60.

Figure 6:
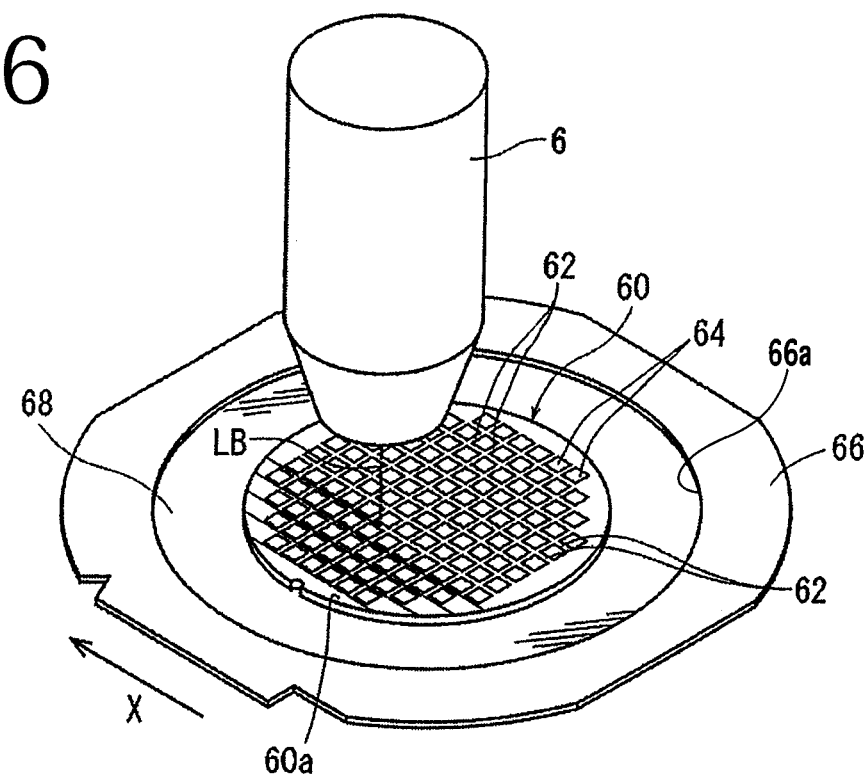
FIG. 6 is a perspective view showing a shield tunnel forming step.
Figure 7A:
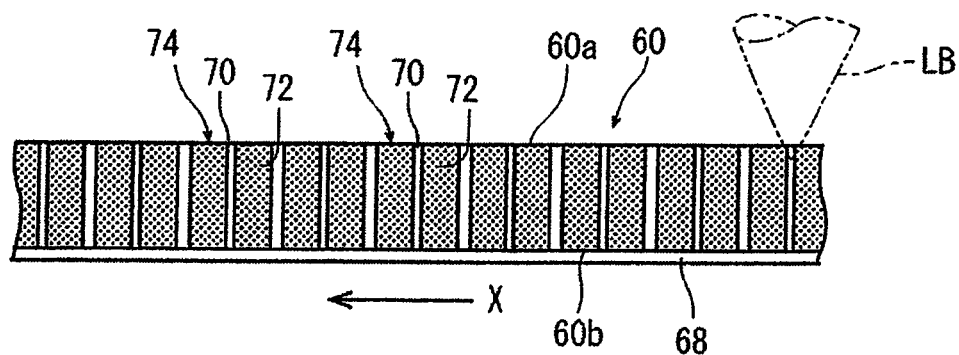
FIG. 7A is a sectional view of the single crystal silicon wafer processed by the shield tunnel forming step.
Figure 7B:
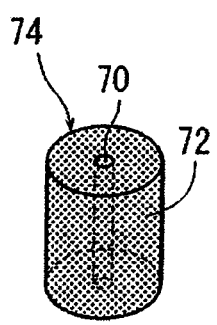
FIG. 7B is a perspective view of a shield tunnel formed by the shield tunnel forming step.

Thereafter, a laser beam applying step is performed to apply the pulsed laser beam LB to the wafer 60 along the predetermined division line 62 as relatively moving the wafer 60 and the focal point FP in the X direction, in which the pulsed laser beam LB has a wavelength of 1950 nm or more in a transmission wavelength region to the wafer 60. As shown in FIG. 6, in the laser beam applying step in this preferred embodiment, the chuck table 20 is moved at a predetermined feed speed in the X direction relative to the focal point FP without moving the focal point FP, by operating the X moving unit 42. As a result, as shown in FIGS. 7A and 7B, a plurality of shield tunnels 74 are formed along the predetermined division line 62, in which each shield tunnel 74 is composed of a fine hole 70 and an amorphous region 72 formed around the fine hole 70 for shielding the fine hole 70, and the fine hole 70 extends from the front side 60a of the wafer 60 as the beam applied surface to the back side 60b of the wafer 60 as the other surface opposite to the beam applied surface. Thereafter, an indexing step is performed to relatively move the wafer 60 and the focal point FP in the Y direction by the pitch of the division lines 62 (i.e., by the spacing between the adjacent division lines 62 aligned with the X direction). In the indexing step in this preferred embodiment, the chuck table 20 is moved by the pitch of the division lines 62 in the Y direction relative to the focal point FP without moving the focal point FP, by operating the Y moving unit 44. Thereafter, the laser beam applying step and the indexing step are alternately repeated to thereby form a plurality of similar shield tunnels 74 along all of the other division lines 62 aligned with the X direction, i.e., extending in the first direction. Thereafter, the rotating unit in the moving unit 40 is operated to rotate the chuck table 20 by 90 degrees, thereby aligning the division lines 62 extending in the second direction with the X direction. Thereafter, the laser beam applying step and the indexing step are alternately repeated to thereby form a plurality of similar shield tunnels 74 along all of the other division lines 62 extending in the second direction perpendicular to the first direction. Thusly, the shield tunnels 74 are formed along all of the crossing division lines 62 extending in the first and second directions.

As described above, the laser processing apparatus 2 includes the laser oscillator 28 for oscillating the pulsed laser beam LB having a wavelength of 1950 nm or more in a transmission wavelength region to the single crystal silicon wafer 60. Accordingly, the shield tunnels 74 can be properly formed in the single crystal silicon wafer 60. Further, the laser processing method according to this preferred embodiment includes the single crystal silicon wafer selecting step of selecting the single crystal silicon wafer 60 as the workpiece, the laser beam selecting step of selecting the pulsed laser beam LB having a wavelength of 1950 nm or more in a transmission wavelength region to the single crystal silicon wafer 60, and the shield tunnel forming step of applying the pulsed laser beam LB to the single crystal silicon wafer 60 along each division line 62 in the condition where the focal point FP of the pulsed laser beam LB is set inside the wafer 60, thereby forming the plural shield tunnels 74 arranged along each division line 62, each shield tunnel 74 being composed of the fine hole 70 and the amorphous region 72 formed around the fine hole 70 for shielding the fine hole 70, the fine hole 70 extending from the front side 60a of the wafer 60 as the beam applied surface to the back side 60b of the wafer 60 as the other surface opposite to the beam applied surface. Accordingly, the shield tunnels 74 can be properly formed in the single crystal silicon wafer 60.

While the laser processing method using the laser processing apparatus 2 has been described in this preferred embodiment, the laser processing method according to the present invention is not limited to such a laser processing method using the laser processing apparatus 2, provided that the laser processing method essentially includes the single crystal silicon wafer selecting step, the laser beam selecting step, and the shield tunnel forming step.

Further, in the above preferred embodiment, the front side 60a of the single crystal silicon wafer 60 is oriented upward in the shield tunnel forming step and the pulsed laser beam LB is applied to the front side 60a of the wafer 60. As a modification, the back side 60b of the single crystal silicon wafer 60 may be oriented upward in the shield tunnel forming step, and the pulsed laser beam LB may be applied to the back side 60b of the wafer 60. In the case that the back side 60b of the wafer 60 is oriented upward, the front side 60a of the wafer 60 where the division lines 62 are formed is oriented downward. However, the division lines 62 formed on the front side 60a of the wafer 60 can be imaged by the imaging unit 38 from the back side 60b of the wafer 60 because the imaging unit 38 includes the infrared light applying unit for applying infrared light, the optical system for capturing the infrared light, and the imaging device (infrared CCD) for outputting an electrical signal corresponding to the infrared light as described above. Accordingly, also in this case, the crossing division lines 62 can be aligned with the X direction and the Y direction, and the focusing means 6 can be positioned directly above one end of each division line 62 aligned with the X direction.

The present inventors conducted a test on the laser beam conditions for formation of proper shield tunnels in a single crystal silicon wafer. Such laser beam conditions will now be described according to the results of the test. A single crystal silicon wafer has a transmission of approximately 55% for infrared light in a predetermined wavelength region. In consideration of this fact, if a laser beam having a wavelength of 1030 nm near the absorption edge of single crystal silicon is used to form shield tunnels, the following possibility may be assumed. That is, in this case, a modified layer may be formed inside the single crystal silicon wafer by the transmission of the laser beam. However, the formation of shield tunnels may be hindered by the absorption of the laser beam, so that proper shield tunnels cannot be formed. Accordingly, the present inventors conducted the test under the conditions that the wavelength of the laser beam was set longer than the absorption edge of single crystal silicon.

(Test 1)

To find out the wavelength of a laser beam for the formation of proper shield tunnels in a single crystal silicon wafer, the present inventors performed laser processing under the following conditions. That is, the focal point of the laser beam was set inside the single crystal silicon wafer, and the laser beam was applied to the wafer as relatively moving the wafer and the focal point at a predetermined feed speed. To form each shield tunnel in the wafer, the focal point of the laser beam is formed so as to be dispersed in the direction of the thickness of the wafer. Accordingly, it is preferable to use a focal region in place of the focal point. The numerical aperture NA of the focusing lens was set in consideration of the test described in Japanese Patent Laid-Open No. 2014-221483 mentioned above, that is, the numerical aperture NA was set so that S=NA/n is in the range of 0.05 to 0.2 ($0.05 \leq S \leq 0.2$), where n is the refractive index of single crystal silicon. Since the refractive index of single crystal silicon is approximately 3.7, the numerical aperture NA was set so that S=NA/n=NA/3.7=0.135 holds. In this case, the numerical aperture NA of the focusing lens was set to 0.5.

Thickness of the single crystal silicon wafer: 700 μm
Wavelength of the pulsed laser beam: 1034 to 2200 nm
Numerical aperture NA of the focusing lens: 0.5
Average power: 3 W
Repetition frequency: 50 kHz
Pulse width: 10 nanoseconds
Feed speed: 500 mm/second (Result of Test 1)

| Wavelength of laser beam (nm) | Quality of shield tunnels |
| --- | --- |
| 1034 | poor |
| 1064 | poor |
| 1300 | poor |
| 1900 | slightly good |
| 1950 | good |
| 2000 | good |
| 2100 | good |
| 2200 | good |

(Conclusion Based on Test 1)

It is apparent from the result of Test 1 that the wavelength of the laser beam capable of forming proper shield tunnels in the single crystal silicon wafer is 1950 nm or more in a transmission wavelength region to the single crystal silicon wafer. Further, in a wavelength region up to approximately 6000 nm, the light transmission of single crystal silicon is approximately 55% (see FIG. 3) as in the above wavelength region where good shield tunnels were formed. Accordingly, it is considered that good shield tunnels can be formed in a single crystal silicon wafer also in a wavelength region up to approximately 6000 nm.

(Test 2)

To find out the relation between the refractive index n of single crystal silicon and the numerical aperture NA of the focusing lens for the purpose of formation of proper shield tunnels in a single crystal silicon wafer, the present inventors performed laser processing under the following conditions. That is, the focal point of the laser beam was set inside the single crystal silicon wafer, and the laser beam was applied to the wafer as relatively moving the wafer and the focal point at a predetermined feed speed.

Thickness of the single crystal silicon wafer: 700 μm
Wavelength of the pulsed laser beam: 1950 nm
Average power: 3 W
Repetition frequency: 50 kHz
Pulse width: 10 nanoseconds
Feed speed: 500 mm/second (Result of Test 2)

| Numerical aperture NA of focusing lens | Quality of shield tunnels | S (S = NA/n) |
| --- | --- | --- |
| 0.05 | poor | 0.014 |
| 0.1 | poor | 0.027 |
| 0.15 | poor | 0.041 |
| 0.2 | good | 0.054 |
| 0.25 | good | 0.068 |
| 0.3 | good | 0.081 |
| 0.35 | good | 0.095 |
| 0.4 | good | 0.108 |
| 0.45 | good | 0.122 |
| 0.5 | good | 0.135 |
| 0.55 | good | 0.149 |
| 0.6 | good | 0.162 |
| 0.65 | good | 0.176 |
| 0.7 | good | 0.189 |
| 0.75 | good | 0.203 |
| 0.8 | poor | 0.216 |
| 0.9 | poor | 0.243 |

(Conclusion Based on Test 2)

It is apparent from the result of Test 2 that the relation between the refractive index n of single crystal silicon and the numerical aperture NA of the focusing lens allowing the formation of proper shield tunnels in the single crystal silicon wafer can be expressed as $0.05 \leq NA/n \leq 0.2$.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus comprising:
   a chuck table for holding a workpiece, said workpiece including a single crystal silicon wafer and having a front side and a back side; and
   a laser beam applying unit including an attenuator and focusing means, said focusing means having a focusing lens for applying a laser beam to a focal point inside said workpiece between said front side and back side of said workpiece, said workpiece held on said chuck table to thereby process said workpiece, and said attenuator configured for adjusting a power of the laser beam;

said laser beam applying unit further including a laser oscillator set for oscillating a pulsed laser beam having a wavelength of 1950 nm in a transmission wavelength region to said single crystal silicon wafer as said laser beam.

2. The laser processing apparatus according to claim 1, wherein the numerical aperture of said focusing lens is set so that the value obtained by dividing the numerical aperture of said focusing lens by the refractive index of single crystal silicon falls within the range of 0.05 to 0.2.

3. The laser processing apparatus according to claim 1, wherein the focusing lens applies the laser beam to a point inside said workpiece.

4. A laser processing method using a laser processing apparatus including a chuck table for holding a workpiece and a laser beam applying unit including focusing means having a focusing lens for applying a laser beam to said workpiece held on said chuck table to thereby process said workpiece, said laser processing method comprising:

a single crystal silicon wafer selecting step of selecting a single crystal silicon wafer as said workpiece;

a laser beam selecting step of selecting a pulsed laser beam having a wavelength of at least 1950 nm in a transmission wavelength region to said single crystal silicon wafer as said laser beam; and a shield tunnel forming step of applying said pulsed laser beam to said single crystal silicon wafer along a predetermined area in the condition where the focal point of said pulsed laser beam is set inside said single crystal silicon wafer, thereby forming a plurality of shield tunnels arranged along said predetermined area, each shield tunnel being composed of a hole and an amorphous region formed around said hole for shielding said hole, said hole extending from a beam applied surface of said single crystal silicon wafer where said pulsed laser beam is applied to the other surface opposite to said beam applied surface, wherein said amorphous regions of adjacent shield tunnels are spaced from each other.

5. The laser processing method according to claim 4, further comprising:

a numerical aperture deciding step of deciding the numerical aperture of said focusing lens so that the value obtained by dividing the numerical aperture of said focusing lens by the refractive index of single crystal silicon falls within the range of 0.05 to 0.2.

6. The laser processing method according to claim 4, wherein the laser beam selecting step includes selecting a pulsed laser beam having a wavelength of 1950 nm to 6000 nm in the transmission wavelength region to said single crystal silicon wafer as said laser beam.

7. The laser processing method according to claim 4, further comprising an adjusting step of adjusting a power of the pulsed laser beam using an attenuator.

\* \* \* \* \*